United States Patent [19]

Yokoyama

[11] Patent Number: 4,531,096
[45] Date of Patent: Jul. 23, 1985

[54] PULSE-WIDTH MODULATION CIRCUIT

[75] Inventor: Kenji Yokoyama, Hamamatsu, Japan

[73] Assignee: Nippon Gakki Seizo Kabushiki Kaisha, Japan

[21] Appl. No.: 536,497

[22] Filed: Sep. 28, 1983

[30] Foreign Application Priority Data

Oct. 9, 1982 [JP] Japan .................. 57-177989

[51] Int. Cl.³ ............................................. H03F 3/38
[52] U.S. Cl. ............................................. 330/10; 330/251
[58] Field of Search ............... 330/10, 207 A, 251; 332/9 R

[56] References Cited

U.S. PATENT DOCUMENTS 3,537,022 10/1970 Regan ................................. 330/10

OTHER PUBLICATIONS

Geelen "Self-Oscillating PWM Amplifier", *Elektor*, vol. 5, No. 9, Sep. 1979, pp. 946-948.

*Primary Examiner*—James B. Mullins
*Attorney, Agent, or Firm*—Kane, Dalsimer, Kane, Sullivan and Kurucz

[57] ABSTRACT

A pulse-width modulation circuit of self-oscillation type produces a pulse-width modulated signal having a pulse width corresponding to an amplitude of an analog input signal. An integrator having an amplifier and at least one capacitor produces a triangle-wave signal. A comparator compares the triangle-wave signal with a reference voltage to generate a pulse signal. A delay circuit produces a delayed pulse signal in response to the pulse signal generated by the comparator. A feedback circuit feeds the delayed pulse signal back to an input terminal of the amplifier so that the self-oscillation is effected. The pulse-width modulated signal is derived from an output terminal of the delay circuit.

12 Claims, 9 Drawing Figures

PULSE-WIDTH MODULATION CIRCUIT

BACKGROUND OF THE INVENTION

1. Field of the Invention

This invention relates to a pulse-width modulation circuit for the amplification of analog signals such as an audio signal, and more particularly to a self-oscillation type pulse-width modulation circuit requiring no carrier signal source.

2. Description of the Prior Art

FIG. 1 shows a conventional direct feedback type pulse-width modulation circuit in which a pulse-width modulated signal is directly fed back to an input thereof. This pulse-width modulation circuit comprises an operational amplifier 1 whose non-inverting input terminal is supplied with an input signal Vi. An inverting input terminal of the operational amplifier 1 is connected to ground through a resistor 2 (value Ra), and a capacitor 3 (value C) for integration is connected between the inverting input terminal and output terminal of the operational amplifier 1. This pulse-width modulation circuit further comprises a hysteresis comparator circuit 4 and a feedback resistor 5 (value Rb) connected between an output terminal of the hysteresis comparator circuit 4 and the inverting input terminal of the operational amplifier 1. The hysteresis comparator circuit 4 comprises an operational amplifier 6, resistor 7 (value R1) and 8 (value R2) and is supplied with an output voltage V1 of the operational amplifier 1 as an input signal. An output signal V0 of this hysteresis comparator circuit 4 appears at an output terminal of the operational amplifier 6.

With this construction, during a period when the output signal V0 is $+E$ (See FIG. 2) the voltage V1 is decreased at a constant slope of $-K1$ since the capacitor 3 is charged with a current determined by the following formula.

$$(E-Vi)/Rb - Vi/Ra$$

And at the time when the voltage V1 drops beyond a negative threshold $-(R1/R2)E$ of the hysteresis comparator circuit 4, the output signal V0 goes to low ($-E$). Then when the output signal V0 is $-E$, the voltage V1 is increased at a constant slope of $+K2$ since the capacitor 3 is discharged with a current determined by the following formula.

$$(Vi+E)/Rb + Vi/Ra$$

And at the time when the voltage V1 rises beyond a positive threshold $+(R1/R2)E$ of the comparator circuit 4, the output signal V0 goes high ($+E$). And thereafter, the above-mentioned operation is repeated.

With this pulse-width modulation circuit, the inclinations $-K1$ and $+K2$ of the voltage V1 vary in accordance with the voltage of the input signal Vi, so that a duty factor D of the output signal V0 linearly varies with the voltage of the input signal Vi while a frequency F of the output signal V0 quadratically decreases with the increase of absolute voltage of the input signal Vi. This pulse-width modulation circuit is therefore suitable for an audio amplifier.

However, it is essential that the output voltage V1 of the operational amplifier 1 should have enough amplitude to exceed both positive and negative threshold levels of the hysteresis comparator circuit 4, since this pulse-width modulation circuit employs hysteresis characteristics of the comparator circuit 4 to obtain self-oscillation conditions. This means that a part of gain of the operational amplifier 1 necessary to obtain a voltage corresponding to the voltage between the thresholds, that is to say, a hysteresis width of the comparator circuit 4, does not contribute to the effective amplification. It will be appreciated that the hysteresis comparator circuit 4 has a dead band correspondind to the hysteresis width. An open-loop gain of this pulse-width modulation circuit is decreased by an amount equal to the gain loss of the operational amplifier 1, so that the distortion reduction effected by the negative feedback is also decreased by the gain loss. Further it is impossible for this pulse-width modulation circuit to lessen solely the hysteresis width to overcome the above-mentioned drawbacks, because the self-oscillation conditions are determined by the hysteresis width.

SUMMARY OF THE INVENTION

It is therefore an object of this invention to provide a pulse-width modulation circuit capable of producing a high open-loop gain.

Another object of this invention is to provide a pulse-width modulation circuit having a low distortion by virtue of distortion reduction effected by a negative feedback.

According to the present invention, there is provided a pulse-width modulation circuit which comprises amplifier means for amplifying an input signal inputted thereto to develop an amplified output signal from an output terminal thereof, the amplifier means having capacitor means connected between the inverting input and output terminals of the amplifier means; delayed pulse generating means for producing an output pulse signal in delayed relation to a resulted signal by comparing the output signal of the amplifier means with a reference voltage, the output pulse signal being outputted from the output terminal thereof; and feedback circuit means for feeding the output pulse signal of the delayed pulse generating means back to the inverting input terminal of the amplifier means; whereby a pulse-width modulated signal having a pulse width corresponding to an amplitude of the input signal appears at the output terminal of the delayed pulse generating means.

DESCRIPTION OF THE PREFERRED EMBODIMENT

Figure 1:
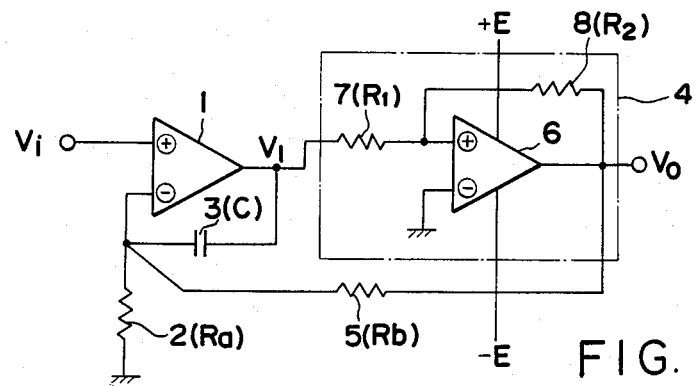
FIG. 1 is a block diagram of a conventional pulse-width modulation circuit.
Figure 2:
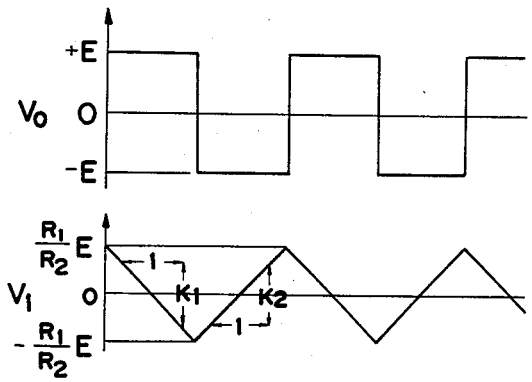
FIG. 2 is a time chart for explaining the operation of the conventional pulse-width modulation circuit of FIG. 1.
Figure 3:
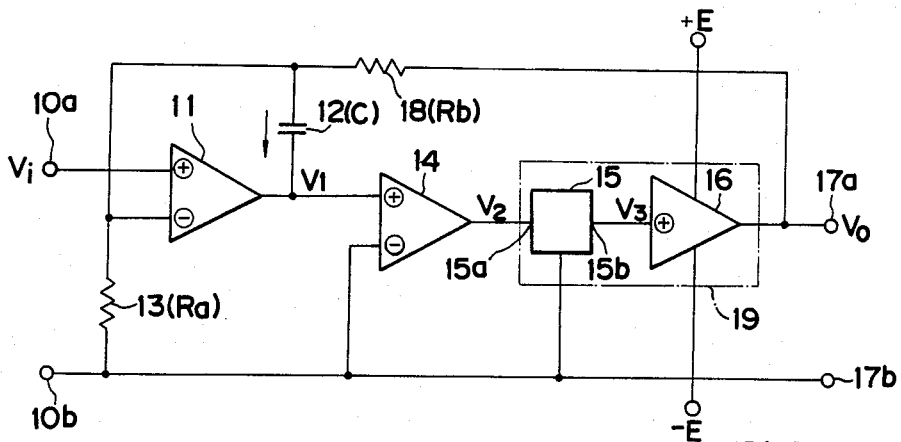
FIG. 3 is a block diagram of a pulse-width modulation circuit according to the present invention.

FIG. 3 shows a block diagram of a pulse-width modulation circuit according to the present invention. In FIG. 3, an input signal Vi is applied between an input terminal 10a and a ground terminal 10b. The input terminal 10a is connected to a noninverting input terminal of an operational amplifier 11. A capacitor 12 (value C) for integration is connected between inverting input and output terminals of the operational amplifier 11, the inverting input terminal being connected to the ground terminal 10b through a resistor 13 (value Ra). The output terminal thereof is connected to a non-inverting input terminal of a comparator 14. This comparator 14 is provided for comparing an output voltage V1 of the operational amplifier 11 with ground level, an inverting input terminal thereof being connected to the ground terminal 10b while an output terminal thereof is connected to an input terminal 15a of a phase shifter 15. This phase shifter 15 is so constructed that the output voltage V3 derived from an output terminal 15b is delayed with respect to the input voltage V2 by a period of time $\phi$, an output terminal thereof being connected to an input terminal of a buffer amplifier 16. The buffer amplifier 16 is supplied with power voltages +E and −E at its positive and negative power input terminals, respectively, and an output terminal thereof is connected to an output terminal 17a of this pulse-width modulation circuit and also to the inverting input terminal of the operational amplifier 11 through a feedback resistor 18 (value Rb). In this case, the phase shifter 15 cooperates with the buffer amplifier 16 to form a pulse amplification circuit 19. A terminal 17b serves as a ground terminal.

Figure 4:
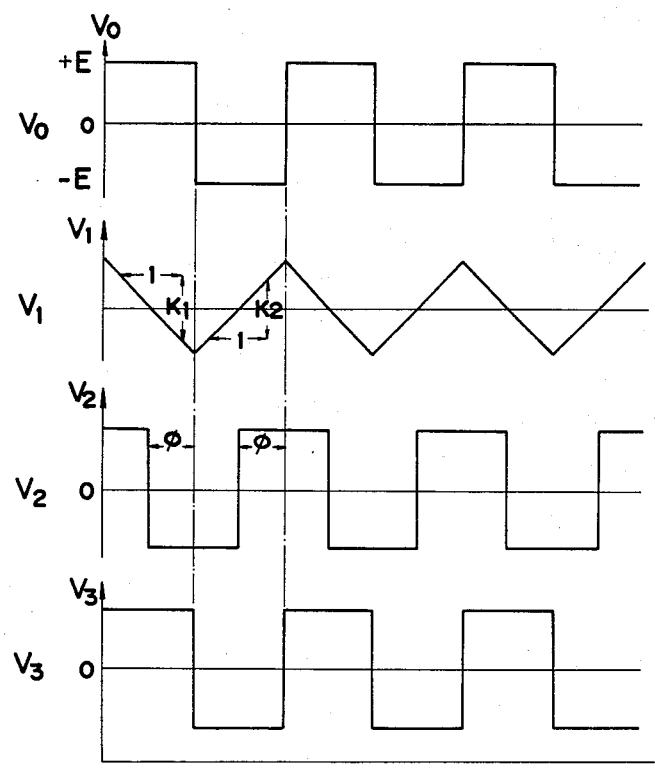
FIGS. 4 and 5 are time charts for explaining the operation of the pulse-width modulation circuit of FIG. 3.

Firstly, conditions of self-oscillation of this pulse-width modulation circuit will be described. A voltage at the inverting input terminal of the operational amplifier 11 is always equal to the input signal Vi by virtue of the provision of an operational amplifier with a feedback loop. It is assumed that an output signal Vo in the form of rectangular waves shown in FIG. 4 is obtained as a result of the operation of this pulse-width modulation circuit. In this case, during a period when the output signal V0 is high (voltage +E), a current determined by the following formula (1) passes through the capacitor 12 in the direction indicated by an arrow in FIG. 3, so that the voltage V1 at the output terminal of the operational amplifier 11 drops at a constant slope −K1 as shown in FIG. 4.

$$(E-Vi)/Rb - Vi/Ra \tag{1}$$

Next, during a period when the output signal V0 is low (voltage −E), a current determined by the following formula (2) passes through the capacitor 12 in the direction opposite to the arrow, so that the voltage V1 rises at a constant inclination +K2.

$$(E+Vi)/Rb + Vi/Ra \tag{2}$$

The voltage V1 thus forms continuous triangular waveshapes as shown in FIG. 4. The voltage V1 is compared with the ground level by the comparator 14, and as a result, the voltage V2 in the form of rectangular waves shown in FIG. 4 is obtained at the output terminal thereof. This voltage V2 has the same duty factor D and frequency F as the output signal V0 but differs in phase from the output signal V0 by $\phi$. Therefore, if the phase of the voltage V2 is shifted or delayed through the phase shifter 15 by $\phi$, the resultant voltage V3 obtained at the output terminal of the phase shifter 15 coincides in phase with the output signal V0, so that the self-oscillation conditions of this pulse-width modulation circuit are perfectly met.

Figure 5:
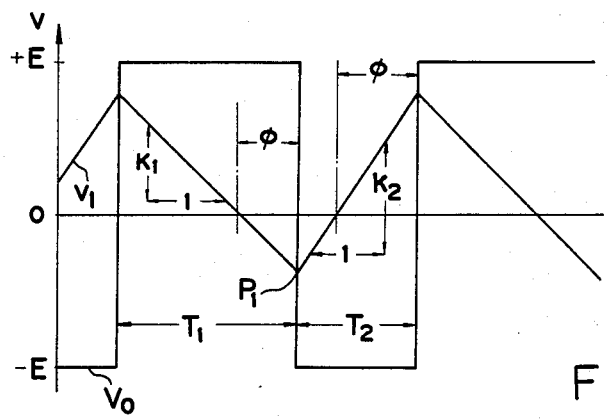

Now, the duty factor D of the output signal V0 in this embodiment will be described in more detail. When the pulse-width modulation circuit is in a stationary state in which the self-oscillation is maintained, the voltage V1 should vary continuously. Therefore, the amount of charge flowing into the capacitor 12 should be equal to the amount of charge flowing therefrom. The amount of charge Q+ flowing into the capacitor 12 during a time period T1 (See FIG. 5) when the output signal V0 is +E can be calculated by the following formula (3) derived from the formula (1).

$$Q+ = ((E-Vi)/Rb - Vi/Ra).T1 \tag{3}$$

In the same manner, the amount of charge Q-flowing from the capacitor 12 during a time period T2 when the output signal V0 is −E can be calculated by the following formula (4) derived from the aforementioned formula (2).

$$Q- = ((E+Vi)/Rb + Vi/Ra).T2 \tag{4}$$

The charges Q+ and Q− should be equal to each other in amount, and ((E−Vi)/Rb−Vi/Ra) and ((E+−Vi)/Rb+Vi/Ra) can be substituted by K1 and K2, respectively. Therefore, the following formulas (5) and (6) are obtained.

$$((E-Vi)/Rb - Vi/Ra).T1 = ((E+Vi)/Rb + Vi/Ra).T2 \tag{5}$$

$$K1.T1 = K2.T2 \tag{6}$$

Therefore, the duty factor D can be expressed as follows:

$$\begin{aligned} D &= T1/(T1 + T2) \\ &= T/(T1 + (K1/K2) \cdot T1) \\ &= K2/(K2 + K1) \\ &= (E + Vi)/Rb + Vi/Ra)/(2E/Rb) \\ &= (1 + (G/E) \cdot Vi)/2 \end{aligned} \tag{7}$$
$$\text{where}$$
$$G = 1 + Rb/Ra$$

It will be readily understood from the formula (8) that the duty factor D varies linearly with the variation of the input signal Vi and that the modulation gain G is determined by the ratio of the value Ra to the value Rb.

Next, the frequency F or the frequency of oscillation of this pulse-width modulation circuit will be described. Reference is first made to the variation of voltage V1 around the negative peak P1 thereof. The following formula (9) can be obtained since the voltage V1 should vary continuously:

$$K1.\phi = K2.(T2 - \phi) \tag{9}$$

And the frequency F is represented by the following formula (10):

$$F = 1/(T1 + T2) = (1 - D)/T2 \tag{10}$$

And then the following formula (11) is obtained by substituting the formula (9) for the formula (10).

$$F = (1-D)/(K1+K2) \cdot \phi/K2) \quad (11)$$

Further, the following formula (12) is obtained by substituting the formula (7) for the formula (11).

$$F = (K1 \cdot K2)/(K1+K2)^2 \cdot \phi) \quad (12)$$

Consequently, the frequency F is represented by the following formula:

$$F = \frac{(E/Rb)^2 - (1/Ra + 1/Rb)^2 \cdot Vi^2}{(2E/Rb)^2 \cdot \phi} \quad (13)$$

$$= Fo \cdot (1 - (G \cdot Vi/E)^2)$$
where $Fo = 1/4\phi$

It is seen from the above formula (13) that the frequency F varies in such a manner that the frequency F quadratically decreases with the increase of absolute voltage of the input signal Vi.

With the construction of this pulse-width modulation circuit, it is not essential for the comparator 14 to have hysteresis characteristics since the self-oscillation conditions can be determined by the phase shift effected by the phase shifter 15. The gain of the operation amplifier 11 is therefore utilized with less loss, so that open-loop gain of the pulse-width modulation circuit becomes greatly high. In addition, the distortion reduction effected by the negative feedback through the resistor 18 is increased. Further with this construction, the duty factor D of the output signal V0 varies linearly with the variation of voltage of the input signal Vi. In addition, the frequency F varies in such a manner that it decreases with the increase of absolute voltage of the input signal Vi, so that the respective circuit portions of this pulse-width modulation circuit including the pulse amplification circuit 19 need less width of band than the conventional pulse-width modulation circuit. This pulse-width modulation circuit is therefore quite suitable for amplification of audio signals.

In the case of the pulse-width modulation circuit described above, the phase shifter 15 is provided in the pulse amplification circuit 19 as an essential circuit. However, an output of a common pulse amplification circuit is delayed by delay factors of its switching control circuit or a delay of switching elements or a delay of the comparator 14. It is therefore possible to obbtain stable self-oscillation conditions by utilizing such delay without providing any particular phase shifters.

Figure 6:
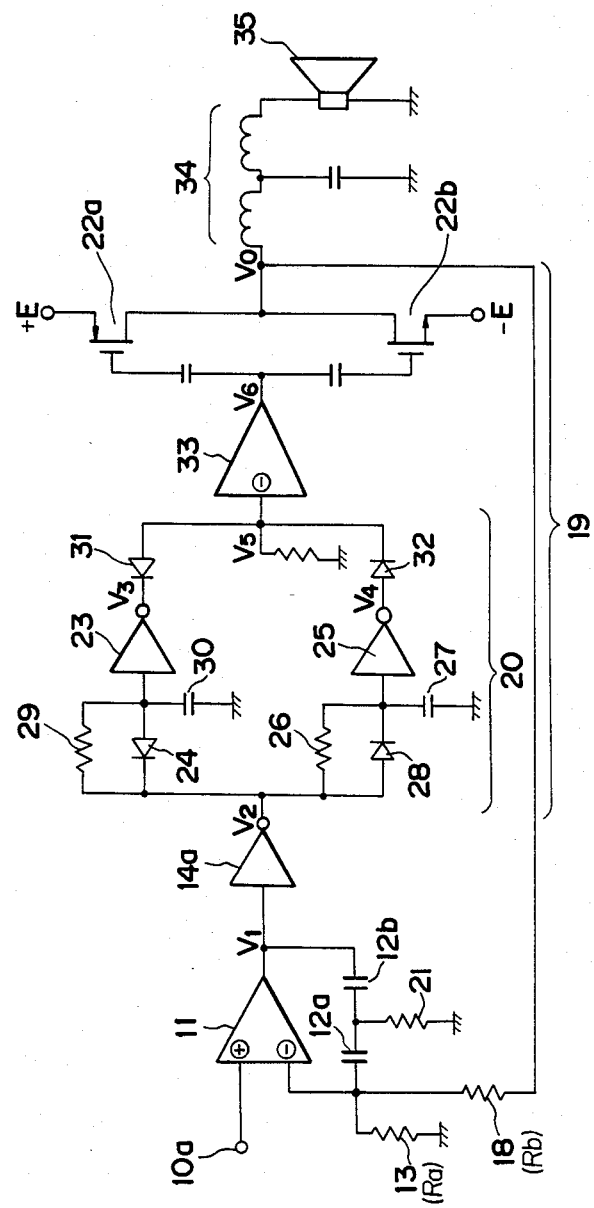
FIG. 6 is a detailed circuit diagram of the pulse-width modulation circuit of FIG. 3.

There is shown in FIG. 6 a circuit diagram of the abovedescribed pulse-width modulation circuit in which an on-off timing control circuit 20 and the inverter 14a function as a phase shifter. The on-off timing control circuit 20 serves to render output-stage switching elements of this pulse-width modulation circuit non-conductive for a certain period of time when the switching elements are in their transit states so as to prevent both switching elements from simultaneously being rendered conductive. Accordingly, no current flows through both switching elements at the same time, so that the power efficiency at the output-stage is improved An operational amplifier 11 in FIG. 6 is provided with two capacitors 12a and 12b serially connected between the inverting input and output terminals thereof, the junction point of these capacitors 12a and 12b being grounded through a resistor 21. The capacitors 12a and 12b and the resistor 21 form a negative feedback network for the operational amplifier 11 which network functions as a secondary lead factor. The integrator comprised of the operational amplifier 11 and the negative feedback network eventually has amplitude transfer characteristics by which the output signal thereof decreases sharply, i.e., at a rate of 12 dB/oct, over the range of higher frequencies than the cutoff frequency of the integrator. Consequently, the passage of the carrier signals through the integrator is more efficiently prevented. The upper cutoff frequency of the integrator can therefore be set higher than that of the integrator with a single capacitor shown in FIG. 3 to improve the frequency characteristics of the overall circuit of this pulse-width modulation circuit.

In operation, the output voltage V1 of the operational amplifier 11 is supplied to an inverter 14a. The inverter 14a is composed of a CMOS gate and functions as a comparator. The output voltage V2 of the inverter 14a is fed to the on-off timing control circuit 20 with a delay of $\phi 1$ based on a delay function of the CMOS gate. This delay of $\phi 1$ shares in the delay time which determines the conditions of self-oscillation. The on-off timing control circuit 20 operates so as to prevent a current from passing serially through field-effect power transistors 22a and 22b, which are the output-stage switching elements of this pulse-width modulation circuit. It is seen from the time chart shown in FIG. 7 that when the output voltage V2 of the inverter 14a falls from a high level (positive voltage) to a low level (negative voltage), the low level signal is immediately supplied to an input terminal of an inverter 23 through a diode 24, so that the output voltage V3 of the inverter 23 rises from the low level to the high level immediately. On the other hand a signal level at an input terminal of an inverter 25 falls gradually from the high level to the low level in accordance with a time constant determined by a resistor 26 and a capacitor 27, since a diode 28 is turned off. As a result, an output voltage V4 of the inverter 25 rises instantaneously from the low level to the high level a certain period of time (delay time of $\phi 2$) after the voltage V2 falled.

At the moment when the voltage V2 rises from the low level to the high level, the high level signal is immediately supplied to the input terminal of the inverter 25, so that the voltage V4 also falls immediately from the high level to the low level. On the other hand, the signal level at the input terminal of the inverter 23 rises gradually from the low level to the high level in accordance with a time constant determined by a resistor 29 and a capacitor 30. As a result, the voltage V3 falls instantaneously from the high level to the low level a certain period of time (delay time of $\phi 2$) after the voltage V2 rose. The delay times of $\phi 2$ in the switching operations of the voltages V3 and V4 are set by the time constants determined by the respective resistor 29 and capacitor 30, and resistor 26 and capacitor 27, and the same delay times $\phi 2$ are obtained by setting such time constants at same values. The delay time of $\phi 2$ shares in the delay time which determines the conditions of self-oscillation. The low-level signal portions of the voltage V3 and the high-level signal portions of the voltage V4 are added together through diodes 31 and 32, and the resultant signal is fed to an input terminal of an inverter-type pulse amplifier 33. The voltage V5 at the input terminal of the pulse amplifier 33 varies as shown in FIG. 7.

Figure 7:
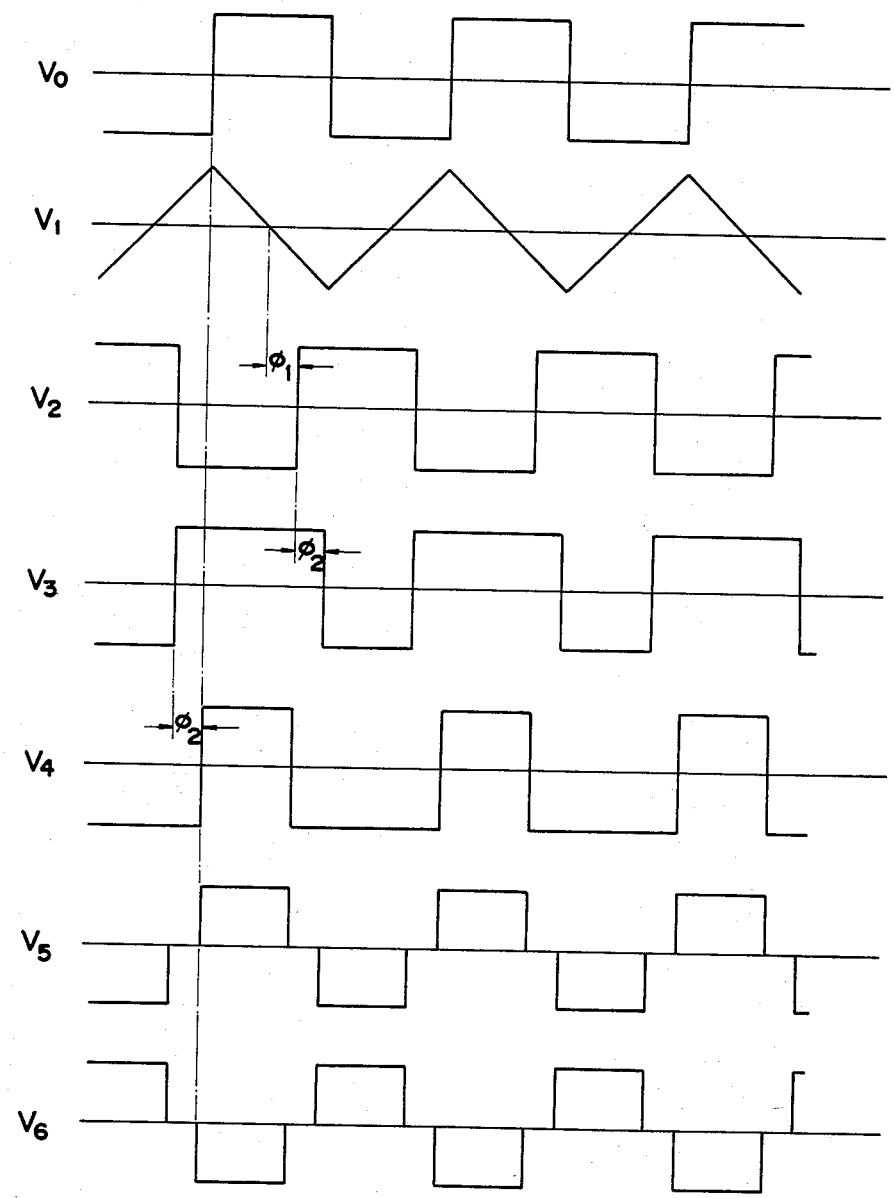
FIG. 7 is a time chart for explaining the operation of the pulse-width modulation circuit of FIG. 6

The complementarily-connected field effect power transistors 22a and 22b are driven by the output voltage V6 of the pulse amplifier 33, so that the output signal V0 shown in FIG. 7 is obtained at the common-drain of the field effect power transistors 22a and 22b. The output signal V0 is demodulated through a low-pass filter 34, and the resultant audio signal is then supplied to a loudspeaker 35. In the case where this pulse-width modulation circuit is required to have an overall gain of 1, the resistor 13 (value Ra) should be omitted from the circuitry shown in FIG. 3 or 6.

Figure 8:
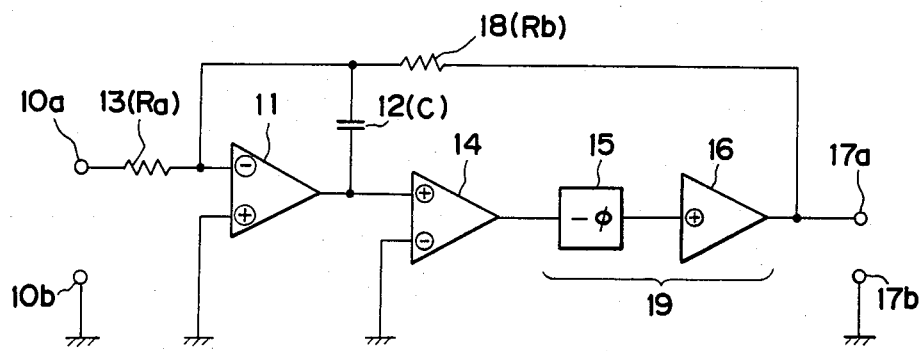
FIG. 8 is a block diagram of a modified pulse-width modulation circuit according to the present invention.

FIG. 8 shows a block diagram of a modified embodiment of the present invention in which like reference characters denote corresponding parts of the above-mentioned embodiment. This pulse-width modulation circuit is constructed so as to operate inversely with respect to the pulse-width modulation circuit shown in FIG. 3. An input impedance of this pulse-width modulation circuit is defined by the value Ra of the resistor 13.

Figure 9:
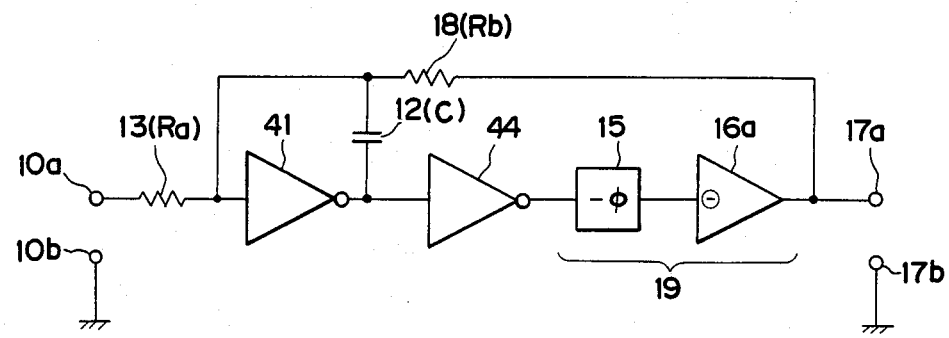
FIG. 9 is a block diagram of a further modified pulse-width modulation circuit according to the present invention.

FIG. 9 shows a block diagram of a further modified embodiment of the present invention in which CMOS gates are employed in order to make the structure thereof simpler. In this case, an inverter 41 composed of a CMOS gate substitutes the operational amplifier 11 and another inverter 44 composed of a CMOS gate substitutes the comparator 14 while an inverter-type pulse amplifier 16a is employed as the pulse amplifier 16.

What is claimed is:

1. A pulse-width modulation circuit which comprises:
   (a) amplifier means for amplifying an input signal inputted thereto to develop an amplified output signal from an output terminal thereof, said amplifier means having an inverting input terminal;
   (b) capacitor means connected between the inverting input and output terminals of said amplifier means;
   (c) comparator means for comparing the output signal of said amplifier means with a reference voltage to output a pulse signal, a pulse width of said pulse signal varying in accordance with a signal level of the output signal of said amplifier means;
   (d) delay circuit means responsive to said pulse signal for producing an output pulse signal in delayed relation to said pulse signal for a certain period of time; and
   (e) feedback circuit means for feeding the output pulse signal of said delay circuit means back to the inverting input terminal of said amplifier means;
   (f) whereby a pulse-width modulated signal having a pulse width corresponding to an amplitude of said input signal appears at an output terminal of said delay circuit means.

2. A pulse-width modulation circuit which comprises:
   (a) amplifier means for amplifying an input signal inputted thereto to develop an amplified output signal from an output terminal thereof, said amplifier means having an inverting input terminal;
   (b) capacitor means connected between the inverting input and output terminals of said amplifier means;
   (c) comparator means for comparing the output signal of said amplifier means with a reference voltage to output a pulse signal, a pulse width of said pulse signal varying in accordance with a signal level of the output signal of said amplifier means;
   (d) delay circuit means responsive to said pulse signal for producing an output pulse signal in delayed relation to said pulse signal for a certain period of time;
   (e) pulse amplifier means for amplifying the output pulse signal of said delay circuit means; and
   (f) feedback circuit means for feeding an output signal of said pulse means back to the inverting input terminal of said amplifier means;
   (g) whereby a pulse-width modulated signal having a pulse width corresponding to an amplitude of said input signal appears at an output terminal of said pulse amplifier means.

3. A pulse-width modulation circuit comprising:
   (a) amplifier means for amplifying an input signal inputted thereto to develop an amplified output signal from an output terminal thereof, said amplifier means having an inverting input terminal;
   (b) capacitor means connected between the inverting input and output terminals of said amplifier means;
   (c) inverter means comprised of a CMOS gate for converting the output signal of said amplifier means into a pulse signal, a pulse width of said pulse signal varying in accordance with a signal level of the output signal of the amplifier means;
   (d) delay circuit means responsive to said pulse signal for producing an output pulse signal in delayed relation to said pulse signal for a certain period of time; and
   (e) feedback circuit means for feeding the output pulse signal of said delay circuit means back to the inverting input terminal of said amplifier means;
   (f) whereby a pulse-width modulated signal having a pulse width corresponding to an amplitude of said input signal appears at an output terminal of said delay circuit means.

4. A pulse-width modulation circuit comprising:
   (a) amplifier means for amplifying an input signal inputted thereto to develop an amplified output signal from an output terminal thereof, said amplifier means having an inverting input terminal;
   (b) capacitor means connected between the inverting input and output terminals of said amplifier means;
   (c) inverter means comprised of a CMOS gate for converting the output signal of said amplifier means into a pulse signal, a pulse width of said pulse signal varying in accordance with a signal level of the output signal of the amplifier means;
   (d) delay circuit means responsive to said pulse signal for producing an output pulse signal is delayed relation to said pulse signal for a certain period of time;
   (e) pulse amplifier means for amplifying the output pulse signal of said delay circuit means; and
   (f) feedback circuit means for feeding an output signal of said pulse amplifier means back to the inverting input terminal of said amplifier means;
   (g) whereby a pulse-width modulated signal having a pulse width corresponding to an amplitude of said input signal appears at an output terminal of said pulse amplifier means.

5. A pulse-width modulation circuit comprising:
   (a) amplifier means for amplifying an input signal inputted thereto to develop an amplified output signal from an output terminal thereof, said amplifier means having an inverting input terminal;
   (b) capacitor means connected between the inverting input and output terminal of said amplifier means;

(c) comparator means for comparing the output signal of said amplifier means with a reference voltage to output a pulse signal, a pulse width of said pulse signal varying in accordance with a signal level of the output signal of the amplifier means;

(d) pulse amplifier means for amplifying the pulse signal outputted from said comparator means, said pulse amplifier means outputting an amplified pulse signal in a delayed relation to said pulse signal for a certain period of time; and (e) feedback circuit means for feeding the output pulse signal of said pulse amplifier means back to the inverting input terminal of said amplifier means;

(f) whereby a pulse-width modulated signal having a pulse width corresponding to an amplitude of said input signal appears at an output terminal of said pulse amplifier means.

6. A pulse-width modulation circuit according to claim 5, in which said pulse amplifier means comprises a logical gate element.

7. A pulse-width modulation circuit comprising:
(a) amplifier means for amplifying an input signal inputted thereto to develop an amplified output signal from an output terminal thereof, said amplifier means having an inverting input terminal;
(b) capacitor means connected between the inverting input and output terminals of said amplifier means;
(c) inverter means comprised of a CMOS gate for converting the output signal of said amplifier means into a pulse signal, a pulse with of said pulse signal varying in accordance with a signal level of the output signal of the amplifier means;
(d) pulse amplifier means for amplifying the pulse signal outputted from said inverter means, said pulse amplifier means outputting an amplified pulse signal in a delayed relation to said pulse signal for a certain period of time; and
(e) feedback circuit means for feeding the output pulse signal of said pulse amplifier means back to the inverting input terminal of said amplifier means;
(f) whereby a pulse-width modulated signal having a pulse width corresponding to an amplitude of said input signal appears at an output terminal of said pulse amplifier means.

8. A pulse-width modulation circuit according to claim 7, in which said pulse amplifier means comprises output-stage switching elements, and an on-off timing control circuit for deactivating said output-stage switching elements for a certain period of time.

9. A pulse-width modulation circuit according to any one of claims 1, 2, 3, 4, 5 and 7, in which said amplifier means further comprises a non-inverting input terminal and non-inversely amplifies said input signal applied to said non-inverting input terminal.

10. A pulse-width modulation circuit according to any one of claims 1, 2, 3, 4, 5 and 7, in which said amplifier means further comprises a non-inverting input terminal and inversely amplifies said input signal applied to said inverting input terminal, said non-inverting input terminal being grounded.

11. A pulse-width modulation circuit according to any one of claims 1, 2, 3, 4, 5 and 7, in which said amplifier means comprises an inverter composed of a CMOS gate.

12. A pulse-width modulation circuit according to any one of claims 1, 2, 3, 4, 5 and 7, in which said capacitor means comprises two capacitors serially connected between the inverting input and output terminals of said amplifier means, a junction point of said two capacitors being grounded through a resistor.

* * * * *